United States Patent

Stanton et al.

[11] Patent Number: 4,595,648
[45] Date of Patent: Jun. 17, 1986

[54] RADIATION-SENSITIVE PLATES FORMED USING DIAZONIUM SALTS

[75] Inventors: Michael Stanton, Garforth; Allen P. Gates, Knaresborough; Rodney M. Potts, Garforth, all of England

[73] Assignee: Vickers Limited, London, United Kingdom

[21] Appl. No.: 649,486

[22] Filed: Sep. 11, 1984

Related U.S. Application Data

[62] Division of Ser. No. 216,963, Dec. 16, 1980, abandoned.

[30] Foreign Application Priority Data

Dec. 18, 1979 [GB] United Kingdom ............... 794359

[51] Int. Cl.$^4$ ................................ G03C 1/54
[52] U.S. Cl. ............................. 430/162; 430/175; 430/171; 430/157
[58] Field of Search ................ 430/162, 175, 171, 157

[56] References Cited

U.S. PATENT DOCUMENTS 2,063,631 12/1936 Schmidt et al. ............... 430/171
3,808,194 4/1974 Piller et al. ................... 260/175
3,867,147 2/1975 Teuscher ...................... 430/157
3,970,460 7/1976 Jagrovic ....................... 430/171
4,334,006 6/1982 Kitajima et al. ............. 430/162 X Primary Examiner—John E. Kittle
Assistant Examiner—Cynthia Hamilton
Attorney, Agent, or Firm—Leydig, Voit & Mayer, Ltd.

[57] ABSTRACT

A radiation sensitive compound contains at least two groups having the structure

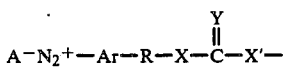

in which Ar represents a divalent or other polyvalent radical derived from an aromatic or heteroaromatic compound; X and X' which may be the same or different, each represents O, S or an imino group, provided that at least one of X and X' is an imino group; Y represents O or S; R represents a single bond or a divalent or other polyvalent radical and $A^-$ is an anion. Radiation sensitive compositions comprising the compound and optionally a resin may be used to produce radiation sensitive plates for lithographic printing plate production.

13 Claims, No Drawings

RADIATION-SENSITIVE PLATES FORMED USING DIAZONIUM SALTS

This is a divisional of application Ser. No. 216,963, filed Dec. 16, 1980, now abandoned.

This invention relates to radiation sensitive materials for use in the manufacture of lithographic printing plates.

Radiation sensitive materials containing diazo compounds are well known for use as lithographic coatings, in particular, those based on the condensation products of diazodiphenylamine and formaldehyde. These condensation products, commonly known as diazo resins, have the disadvantage, in their simple form, of being soluble only in water which can cause problems in coating the radiation sensitive material on to certain substrates, particularly metal substrates. Also the resulting lithographic plate is likely to have a short storage life.

It is known in the art to render diazo resins soluble in organic solvents by reacting them with a suitable material which possibly reduces their ionic character and makes them more covalent. It is also known to incorporate a binder resin into the coating to produce a lithographic plate having a longer press life.

These materials are well documented in the patent literature and reference may be made to British Patent Specification Nos. 950761, 1019919, 1023589, 1055079, 1302717, 1312925 and 1388038.

According to the present invention, there is provided a radiation sensitive compound containing at least two groups having the structure

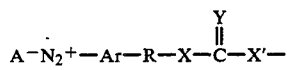

in which Ar represents a substituted or unsubstituted divalent or other polyvalent radical derived from an aromatic or heteroaromatic compound; X and X' which may be the same or different each represents O, S or a substituted or unsubstituted imino group provided at least one of X and X' is a substituted or unsubstituted imino group; Y represents O or S; R represents a single bond or a substituted or unsubstituted divalent or other polyvalent radical and A represents an anion.

Ar may be, for example, phenylene, naphthylene or benzothiazolylene. It may include substituent groups such as alkyl, aryl, alkoxy, aryloxy, dialkylamino, arylmercapto, halogeno, nitro or carboxy. The substituent may confer extra light sensitivity. For example, it may be or may contain a diazo, azido or styryl group. Advantages in terms of stability and light sensitivity are conferred by a substituent amino or arylmercapto group in the para position to the main diazo group. The stability may be further increased by introduction of an additional substituent, such as an alkoxy group, ortho to the diazo group.

The radical (R) may be, for example, substituted or unsubstituted alkylene, arylene, or a combination thereof. The radical may contain one or more heteroatoms providing groupings such as are shown by formulae 2 to 11.

The radical R may contain one or more diazo groups and may by typified by the structure

where $R_1$ provides a link moieties containing the other diazo groups in which case it may be ethylene, phenylene, succinoyl bis oxy ethyl, methylidene amino or N,N-2,4-tolylene bis carbamoyloxyethyl or it may be a single bond when the moiety is p-diazophenyl group.

When X or X' is a substituted imino group (—NR₂), R₂ may be a di or polyvalent radical and as such may be the same as R₁. Alternatively, R₂ may be methyl, phenyl, acetoxy ethyl, cinnamoyl oxy ethyl or azidobenzoyl oxy propyl.

Ar, R and R₂ when polyvalent radicals, may combine together or in pairs, to form a carbocyclic or heterocyclic ring or ring system.

In one embodiment the compounds have the structure:

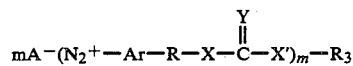

in which R₃ is a divalent or other polyvalent radical such as shown by formulae 14 to 29.

Alternatively, R₅ in formulae 24 and 25 may be any polymer containing —OH, —SH, —NH—, —NH₂, or —CONH₂ groups. In the above formulae, m is an integer greater than or equal to 2 and n, p, q, r, s and t are all integers greater than or equal to 1.

Preferred examples are shown by formulae 30 to 49.

In another embodiment the

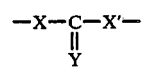

groupings are an integral part of a polymer backbone. In this case the repeating unit may be represented by:

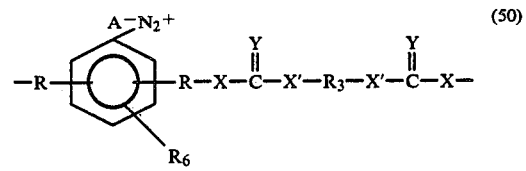

Where R₆ is a substituent which may be the same as the substituents on Ar or hydrogen; or by:

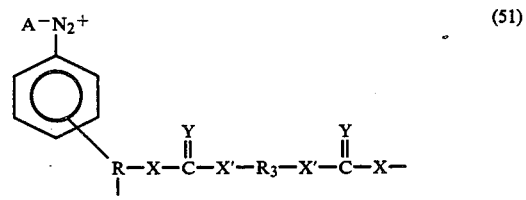

Preferred examples are shown by formulae 52 and 53.

The anion A⁻ may be p-toluene sulphonate, naphthalene sulphonate, dodecyl benzene sodium sulphonate, dicyclohexylsulphosuccinate di octyl sulphosuccinate, triisopropyl naphthalene sulphonate, diisobutyl naphthalene sulphonate, 2-hydroxy 4 methoxy benzophenone-5-sulphonate, mesitylene sulphonate, octyl phenyl sulphonate, lauryl sulphate, naphthoate, cinnamate, tetrafluoroborate, hexafluorophosphate or reineckate.

The diazo compound of the invention can, by treating the water soluble salt with sodium cyanide, sodium sulphite, sodium azide, a sulphonic acid or a salt thereof, or an amine, be converted to the corresponding diazo cyanide, sulphonate, azide, diazosulphone, or diazo amino compound.

Whilst radiation sensitive compositions containing the compounds of this invention may be coated onto any of the well known substrate materials such as paper, synthetic resin, copper, chromium or steel to form a lithographic printing plate, aluminium is preferred for a variety of reasons well known in the art.

The surface of the aluminium substrate may be treated to improve its lithographic qualities in a number of ways well known in the art. For example, it may be grained to increase its water holding capacity and improve the adhesion of the light sensitive composition, anodised to increase its abrasion resistance and hydrophilic nature and/or treated with a material such as a water soluble silicate, phytic acid, fluorozirconate, polyacrylic acid or polyvinyl phosphonic acid to increase the stability of the composition by reducing or preventing interaction between the composition and the surface.

To prolong the press life of the lithographic printing plate, a suitable binder resin may be incorporated in the radiation sensitive composition. Suitable resins are epoxy resins, phenolic resins, acrylic resins, polyamides, polystyrenes, poly(vinyl chlorides), poly(vinyl acetates), polyesters, polyacetals and polyurethanes. Adhesion promoters, colourants, sensitisers, crosslinking agents, development aids, plasticisers and/or other radiation sensitive materials may be included in the radiation sensitive composition.

The compounds of the invention may be prepared by (1) reacting a compound containing a diazo group or diazo group precursor and having either (a) one or more —OH, —SH, —NH$_2$, or —NH— groups or (b) a plurality of —NCO, —NCS, —OCOCl or >NCOCl groups with a compound having either (a) a plurality of —NCO, —NCS, —OCOCl or >NCOCl groups or (b) one or more —OH, —SH, —NH$_2$, or —NH— groups (2) converting the diazo group as necessary into a diazo group and (3) reacting the diazo group with an acid of formula HA or with a salt of such acid to form the desired compound.

The use of a compound containing a diazo group precursor, i.e. a group capable of being converted to a diazo group, is preferred because there is a risk of substantial loss of diazo groups during the reaction.

According to a preferred method, the first step is carried out by reacting a first reactant of the formula

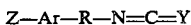

where Z is a diazo group or a diazo group precursor, with an isocyanate or isothiocyanate of the formula (YCN)$_2$R$_3$ to produce a compound of the formula

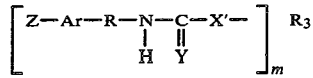

According to another preferred method, the first step is carried out by reacting a first reactant of the formula

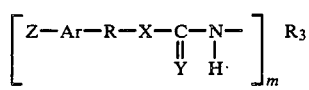

with a compound of the formula (HX')$_m$R$_3$ to form a compound of the formula

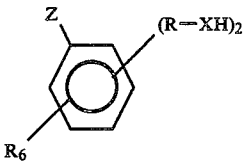

According to a further preferred method, the first step is carried out by reacting a first reactant of the formula

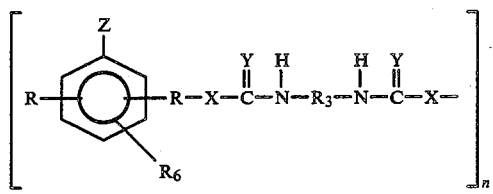

with an isocyanate or isothiocyanate of the formula (YCN)$_2$R$_3$ to form a compound of the formula

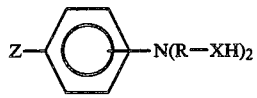

According to yet a further preferred method, the first step is carried out by reacting a first reactant of the formula

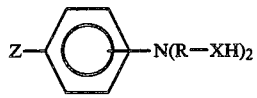

with an isocyanate or isothiocyanate of the formula (YCN)$_2$R$_3$ to form a compound of the formula

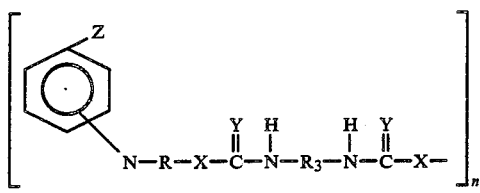

Suitable starting materials are isocyanates such as are shown by formulae 54 to 66. Other suitable starting materials are diethylene glycol bis chloroformate, 4,4'-bis(chlorocarbonyloxy ethoxy)diphenyl methane, p-phenylene-N-N'-dimethyl dicarbamoyl chloride or hexamethylene-N,N'-dimethylene dicarbamoyl chloride.

Examples of suitable diazonium precursors are:

1. Protected amines as shown by formulae 67 to 69.

The free amines are diazotised in the normal manner. Other amino protective groups are described in Advanced Organic Chemistry, Vol. 3, 159, 1963 (R. A. Boissonnas).

2. Nitro compounds as shown by formulae 70 to 74.

The nitro groups can be reduced to give diazotisable amines.

3. Azo compounds as shown by formulae 75 and 76.

The azo links can be cleaved by reduction to give the desired amine intermediate.

There are various less well known ways of introducing the diazo group, some of which are mentioned in "The Chemistry of the Diazonium and Diazo Groups" Part 2, Chapter 14, edited by S. Patai.

The synthesis may be carried out in the following stages:

STAGE 1—Reaction of the diazo precursor with the —NCO, —NCS, —OCOCl or >NCOCl group containing compound.

STAGE 2—Introduction of an amine group.

STAGE 3—Diazotisation

Two typical syntheses are those of compound 30 using p-(N-ethyl-N-2-hydroxy ethyl)amino acetanilide (69) and 2,4 toluene diisocyanate (54), and compound 36 using 5-nitro indozole (74) and isophorone diisocyanate (59)

Synthesis of compound 30.

STAGE 1

P-(N-ethyl-N-2-hydroxy ethyl)amino acetanilide (2 mole) in n-methyl pyrrolidone was added to a solution of 2,4 toluene diisocyanate (1 mole) in n-methyl pyrrolidone at room temperature. Dibutyl tin dilaurate was added as catalyst and the mixture was heated to 50 degC. for five hours, cooled and dripped into water with vigorous stirring. The resulting precipitate was filtered off and washed with water.

STAGE 2

The damp stage 1 product was mixed with 6N hydrochloric acid and refluxed for 2 hours. Each resulting solution was neutralised with sodium hydroxide and the resulting precipitate washed with water and dried.

STAGE 3

The Stage 2 product (1 mole) was added to 6N hydrochloric acid and the mixture cooled to 5 degC. Sodium nitrite solution (1.05 mole) was introduced dropwise, the temperature being maintained below 10 degC. When diazotisation was complete, the solution was mixed with an aqueous solution of sodium lauryl sulphate and the product isolated by filtration.

Sythesis of compound 36.

STAGE 1

5-Nitro indazole (40 mmol) was dissolved in a mixture of N-methyl pyrrolidone and toluene. Isophorone diisocyanate (19 mmol) was added and the mixture heated to 100 degC. Dibutyl tin dilaurate as catalyst was added. The temperature was maintained for 5 hours then the solution was cooled and the toluene removed by evaporation. Ethanol was added to the residue which was then poured into water. The water was decanted and the residual solid triturated with acetone to obtain the product.

STAGE 2

The Stage 1 product (9 mmol) was suspended in ethanol and hydrazine hydrate was added followed by palladium on charcoal as catalyst. The suspension was refluxed for 2 hours until a solution was obtained. The spent catalyst was filtered off and the filtrate dripped into water. The resulting precipitate was filtered off and washed with water.

STAGE 3

The Stage 2 product (8 mmol) was dissolved in dimethyl formamide and the solution was dripped into dilute hydrochloric acid. The resulting suspension was cooled to 5 degC. and sodium nitrite (17 mmol) added. When diazotisation was complete, the solution was added to an aqueous solution of p-toluene sulphonate and the final product isolated by filtration.

The following examples illustrate the invention:

EXAMPLE 1

The diazo compound (35) derived from the reaction product of P-(N-ethyl-N-2-hydroxy ethyl)amino acetanilide (69) and diphenyl methane 4,4' diisocyanate (56) with lauryl sulphate as anion was dissolved in 1,2 dichloroethane and whirler coated on to an electrochemically grained, anodised and silicated sheet of aluminium and dried. The coating weight was 0.8 gm$^{-2}$.

The resultant radiation sensitive plate was exposed beneath a half-tone negative to a 4 KW pulsed Xenon lamp at a distance of 1 meter for 1 minute. The plate was developed with an aqueous solution containing 10% anionic surfactant and 10% benzyl alcohol.

When placed on a press the plate produced many satisfactory copies.

EXAMPLE 2

The diazo compound (31) derived from the reaction product 4-amino-2,5-diethoxy acetanilide (67) and 2,4 toluene diisocyanate (54) with tri isopropyl napthalene sulphonate as anion was dissolved in ethylene glycol monomethyl ether and whirler coated on to an electrolytically grained, anodised and silicated aluminium sheet and dried. The coating weight was again 0.8 gm$^{-2}$.

The resulting plate was exposed and developed in the same way as the plate of Example 1. Similar results were obtained.

EXAMPLE 3

Example 1 was repeated except that 2-hydroxy 4 methoxy benzophenone 5 sulphonate was used as the anion and ethylene glycol monomethyl ether was used as the coating solvent. Similar results were obtained.

EXAMPLE 4

The diazo compound (36) derived from the reaction product of 5-nitroindazole (74) and isophorone diisocyanate (59) with p-toluene sulphonate as anion was dissolved in ethylene glycol monomethylether and whirler coated on to an electrochemically grained and anodised aluminium sheet which had been further treated with polyacrylic acid.

The resulting plate was exposed and developed in the same way as the plate of Example 1. Similar results were obtained.

EXAMPLE 5

Example 4 was repeated except that the coating contained an acrylic resin (Macronal SN510, manufactured by Resinous Chemicals, a division of Hoechst AG). A plate with an improved press life was produced.

EXAMPLE 6

The diazo compound (41, 42) derived from the reaction product of P-(N-ethyl-N-2-hydroxy ethyl)amino acetanilide (69) and IPDI-T 1890 (60) with dioctyl sulphosuccinate as anion was dissolved in ethylene glycol mono methyl ether and whirler coated on to an electrochemically grained and anodised aluminium sheet which had been further treated with poly vinyl phosphonic acid. The resulting plate was exposed and developed in the same way as the plate of Example 1. Similar results were obtained.

EXAMPLE 7

The diazo compound (40) derived from the reaction product of 3-methoxy-4-nitro-N,N-diphenyl carbamoyl chloride and diethylene glycol with mesitylene sulphonate as anion was dissolved in ethylene glycol monomethyl ether and whirler coated on to an electrochemically grained and anodised aluminium sheet which had been further treated with poly vinyl phosphonic acid. The resulting plate was exposed and developed in the same way as the plate of Example 1. Similar results were obtained.

EXAMPLE 8

The reaction product of 1 equivalent of p-(N-ethyl-N-hydroxyethyl amino)acetanilide (69) and 2 equivalents of isophorone diisocyanate (59) was further reacted with an equivalent weight of allyl alcohol-styrene copolymer. The resulting material was hydrolysed to remove the protecting acetyl group and then diazotised (Compound 41,45). The 2-hydroxy-4-methoxy benzophenone-5-sulphonate salt of the product was dissolved in ethylene glycol monomethyl ether and whirler coated on to an electrochemically grained and anodised aluminium sheet which had been further treated with poly vinyl phosphonic acid. The resulting plate was exposed and developed in the same way as the plate of Example 1. Similar results were obtained.

EXAMPLE 9

The diazo compound (48) derived from the reaction product of 2,5-dimethoxy-4-nitrophenyl isocyanate (73) and trimethylol propane with p-toluene sulphonate as anion was dissolved in ethylene glycol monomethyl ether and whirler coated on to an electrochemically grained and anodised aluminium sheet which had been further treated with poly vinyl phosphonic acid. The resulting plate was exposed and developed in the same way as the plate of Example 1. Similar results were obtained.

EXAMPLE 10

The polymeric diazo compound (52) derived from the reaction product of p-(N,N-bishydroxy ethyl amino)-acetanilide and toluene 2,6-diisocyanate with mesitylene sulphonate as anion was dissolved in ethylene glycol monomethyl ether and whirler coated on to an electrochemically grained and anodised aluminium sheet which had been further treated with poly vinyl phosphonic acid. The resulting plate was exposed and developed in the same way as the plate of Example 1. Similar results were obtained.

$$A^-N_2^+ - Ar - R - X - \underset{\underset{Y}{\|}}{C} - X' - \quad (1)$$

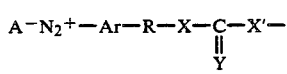  (2)

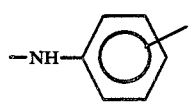  (3)

  (4)

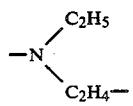  (5)

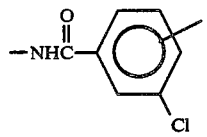  (6)

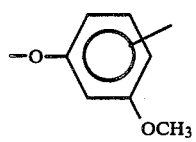  (7)

$$-NCH_3CH_2\overset{O}{\underset{\|}{C}}- \quad (8)$$

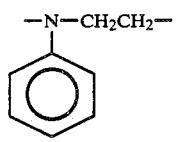  (9)

$$-O-CH_2\underset{\underset{}{|}}{\overset{CH_3}{C}H}- \quad (10)$$

$-N-CH_2CH_2-$  (11)

$-NR_1CH_2CH_2-$  (12)

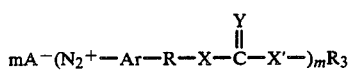 (13)
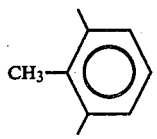 (14)
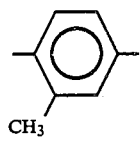 (15)
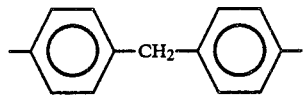 (16)
 (17)
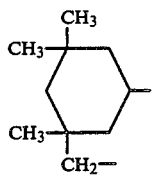 (18)
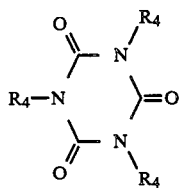 (19)
where $R_4$ is 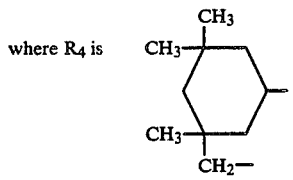 (20)
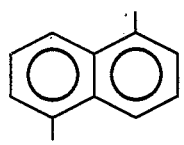 (21)
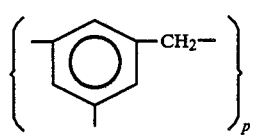 (22)
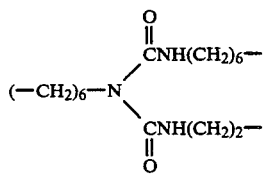 (23)
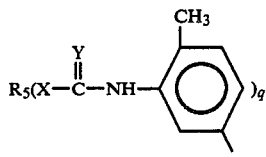 (24)
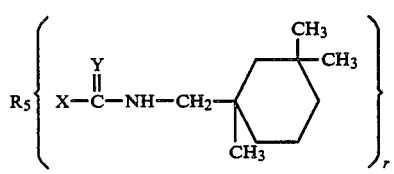 (25)
in which $R_5$ may be $-(CH_2-)_s$ (26)
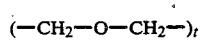 (27)
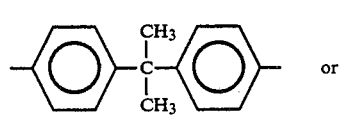 or (28)
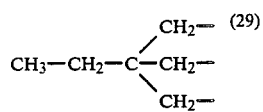 (29)
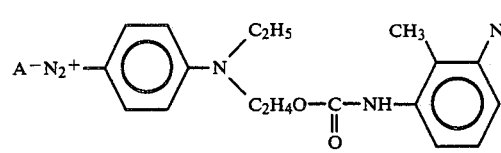 (30)

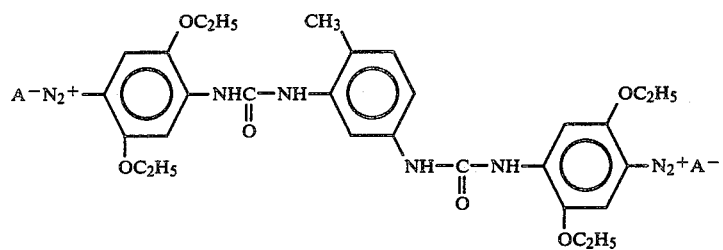
(31)
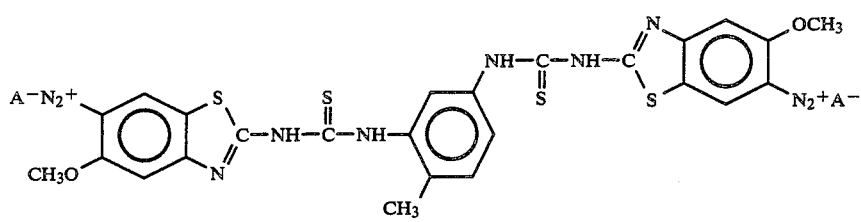
(32)
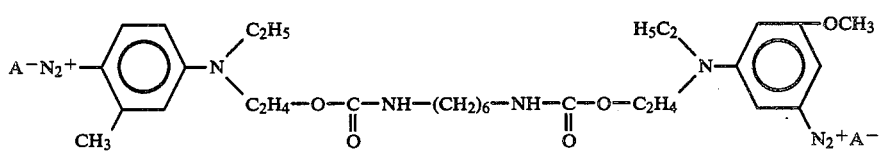
(33)
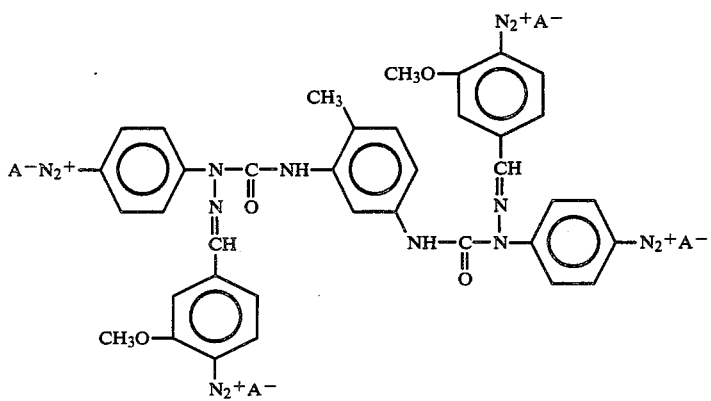
(34)
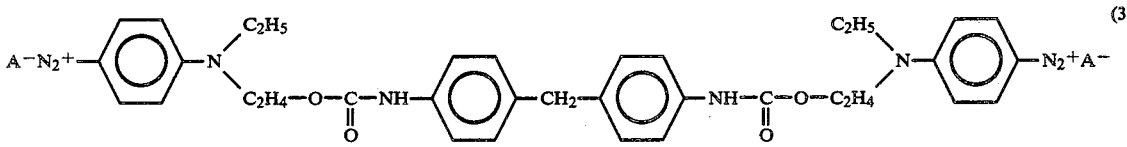
(35)
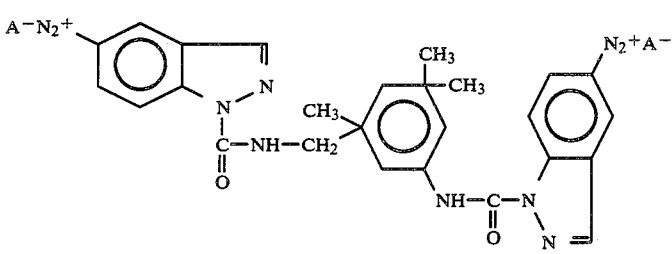
(36)

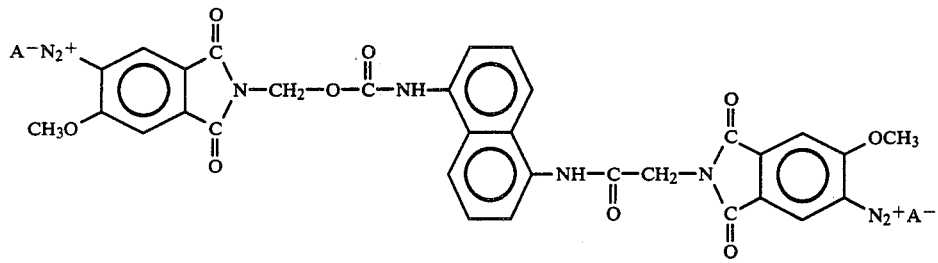
(37)
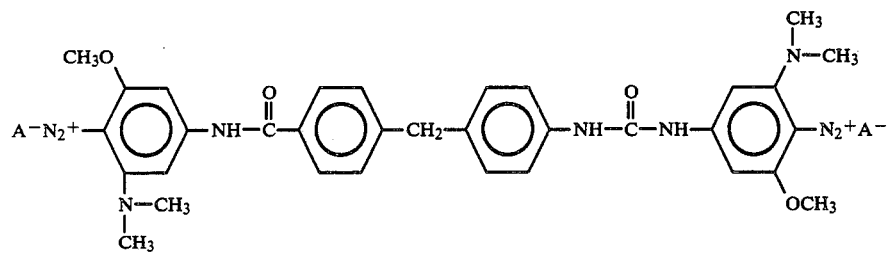
(38)
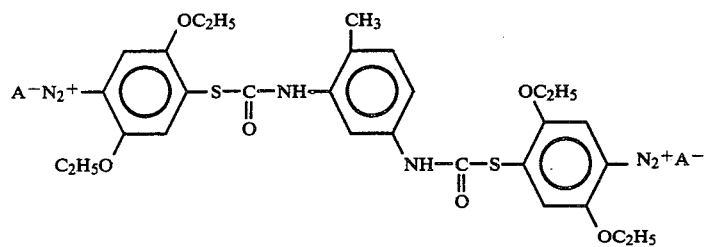
(39)
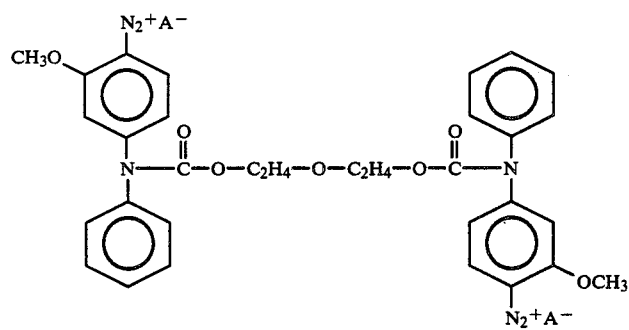
(40)
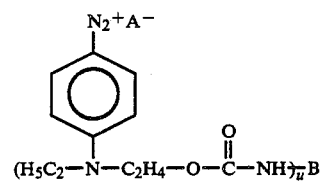
(41)
where u is greater than or equal to 3 and where B is
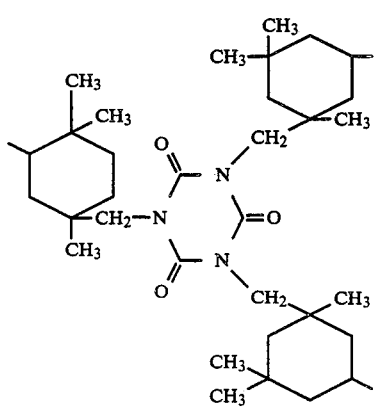
(42)
-continued
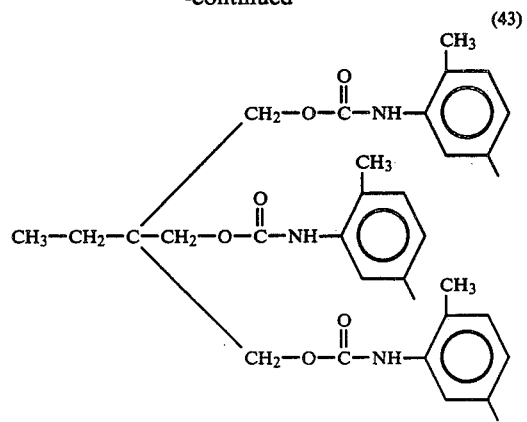
(43)

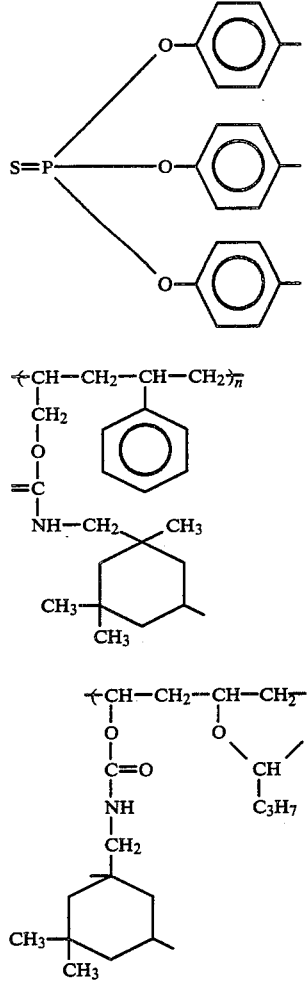
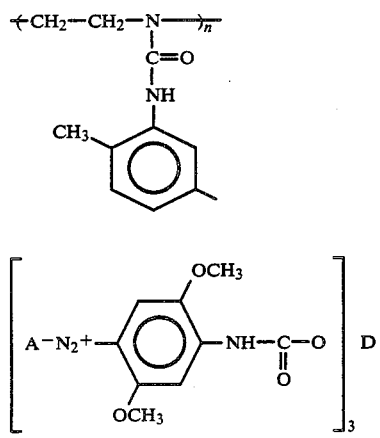
where D is
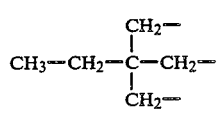
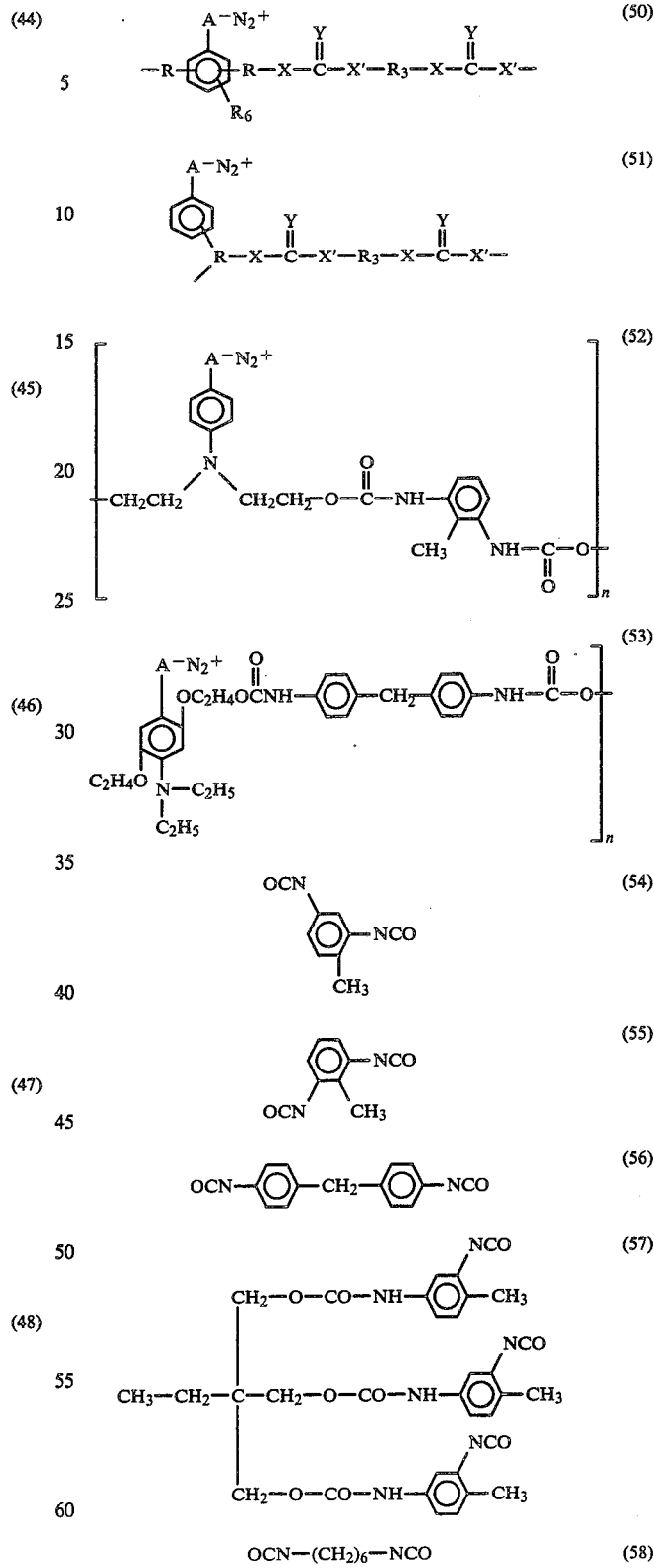
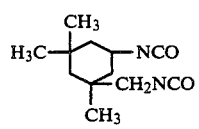

We claim:

1. A radiation sensitive plate comprising a substrate coated with a radiation sensitive compound containing at least two groups having the structure $$A^-N_2{}^+-Ar-R-X-\overset{\overset{Y}{\|}}{C}-X'-$$

in which Ar represents a divalent or other polyvalent radical derived from an aromatic or heteroaromatic compound; X and X' are different and each represents O, S or an imino group, provided that one of X and X' is an imino group; Y represents O or S; R represents a single bond or a divalent or other polyvalent radical and $A^-$ is an anion.

2. A radiation sensitive plate as claimed in claim 1, wherein the radical Ar is a phenylene, naphthylene or benzothiazoylene radical.

3. A radiation sensitive plate as claimed in claim 1 wherein the radical R is an alkylene radical, an arylene radical, a combination of an alkylene and an arylene radical, or a radical including a hetero atom.

4. A radiation sensitive plate as claimed in claim 1 wherein the radical R contains one or more diazo groups and has the structure $-NR_1CH_2CH_2-$ where $R_1$ provides a link with moieties containing said diazo group or groups and is an ethylene, phenylene, succinoyl bis oxy ethyl, methylidene amino or N,N-2,4-tolylene bis carbamoyloxyethyl group or is a single bond when the moiety is a diazodiphenyl group.

5. A radiation sensitive plate as claimed in claim 1 wherein one of X and X' is an imino group substituted with a methyl, phenyl, acetoxy ethyl, cinnamoyl oxy ethyl or azidobenzoyl oxy propyl radical.

6. A radiation sensitive plate as claimed in claim 1 wherein said compound has the structure $$mA^-(N_2{}^+-Ar-R-X-\overset{\overset{Y}{\|}}{C}-X')_m R_3$$

in which $R_3$ is a divalent or other polyvalent radical, m is an integer greater than 1 and A, Ar, R, X, X' and Y have the meanings set out in claim 1.

7. A radiation sensitive plate as claimed in claim 1 wherein the $$X-\underset{\underset{Y}{\|}}{C}-X'$$

groupings are an integral part of a polymer backbone.

8. A radiation sensitive plate as claimed in claim 1 wherein the anion $A^-$ is p-toluene sulphonate, naphthalene sulphonate, dodecyl benzene sodium sulphonate, dicyclohexylsulphosuccinate, dioctyl sulphosuccinate, triisopropyl naphthalene sulphonate, diisobutyl naphthalene sulphonate, 2-hydroxy-4-methoxy benzophenone-5-sulphonate, mesitylene sulphonate, octyl phenyl sulphonate, lauryl sulphate, naphthoate, cinnamate, tetrafluoroborate, hexafluorophosphate or reineckate.

9. A radiation sensitive plate as claimed in claim 1 wherein said compound includes three groups having said structure.

10. A radiation sensitive plate as claimed in claim 1 wherein said compound is in admixture with a resin.

11. A radiation sensitive plate as claimed in claim 1 wherein said substrate is formed of aluminum.

12. A radiation sensitive plate as claimed in claim 11 wherein the aluminum is grained and anodised aluminum.

13. A radiation sensitive plate comprising a substrate coated with a radiation sensitive compound containing at least two groups having the structure $$A^--N_2{}^+-Ar-R-X-\overset{\overset{Y}{\|}}{C}-X'-$$

in which Ar represents a divalent or other polyvalent radical derived from an aromatic or heteroaromatic compound; X and X' are different and each represents O, S or an imino group, provided that one of X and X' is an imino group; Y represents O or S; R represents a single bond or a divalent or other polyvalent radical and $A^-$ is an anion selected from the group consisting of p-toluene sulphonate, naphthalene sulphonate, dodecyl benzene, sodium sulphonate, dicyclohexylsulphosuccinate, dioctyl sulphosuccinate, triisoproyl naphthalene sulphonate, diisobutyl naphthalene sulphonate, 2-hydroxy-4-methoxy benzophenone-5-sulphonate, mesitylene sulphonate, octyl phenyl sulphonate, lauryl sulphate, naphthoate, cinnamate, tetrafluoroborate, hexafluorophosphate and reineckate anions.

* * * * *